(12) United States Patent
Li

(10) Patent No.: US 11,137,657 B2
(45) Date of Patent: Oct. 5, 2021

(54) DISPLAY APPARATUS

(71) Applicant: PlayNitride Display Co., Ltd., MiaoLi County (TW)

(72) Inventor: Yun-Li Li, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 0 days.

(21) Appl. No.: 17/010,847

(22) Filed: Sep. 3, 2020

(65) Prior Publication Data

US 2021/0191174 A1 Jun. 24, 2021

Related U.S. Application Data

(60) Provisional application No. 62/950,129, filed on Dec. 19, 2019.

(30) Foreign Application Priority Data

Apr. 10, 2020 (TW) .................................. 109112114

(51) Int. Cl.
*G02F 1/139* (2006.01)
*H01L 25/04* (2014.01)
(Continued)

(52) U.S. Cl.
CPC ...... *G02F 1/1393* (2013.01); *G02F 1/133512* (2013.01); *G02F 1/133536* (2013.01); *G02F 1/133553* (2013.01); *G02F 1/133603* (2013.01); *H01L 25/046* (2013.01); *G02F 2203/50* (2013.01)

(58) Field of Classification Search
CPC ......... G02F 1/133603; G02F 1/133553; G02F 1/133536; G02F 1/133557; H01L 27/3232
See application file for complete search history.

(56) References Cited

U.S. PATENT DOCUMENTS

2017/0090246 A1* 3/2017 Seo ..................... H01L 51/5056

FOREIGN PATENT DOCUMENTS

| CN | 108878626 | 11/2018 |
|---|---|---|
| CN | 109671735 | 4/2019 |

(Continued)

OTHER PUBLICATIONS

"Office Action of Taiwan Counterpart Application", dated Jan. 26, 2021, p. 1-p. 6.

*Primary Examiner* — Jessica M Merlin
(74) *Attorney, Agent, or Firm* — JCIPRNET

(57) ABSTRACT

A display apparatus including an electrically-controlled phase retardation layer, a reflective polarizer, a micro light emitting diode panel and a reflective layer is provided. The electrically-controlled phase retardation layer has a first side and a second side opposite to each other. The reflective polarizer is disposed at the first side of the electrically-controlled phase retardation layer. The micro light emitting diode panel is disposed at the second side of the electrically-controlled phase retardation layer and includes a circuit substrate and a plurality of micro light emitting diodes. The reflective layer is disposed between the reflective polarizer and the circuit substrate. An orthogonal projection of the reflective layer on the circuit substrate is not overlapped with orthogonal projections of the micro light emitting diodes on the circuit substrate.

12 Claims, 9 Drawing Sheets

(51) Int. Cl.
*G02F 1/1335* (2006.01)
*G02F 1/13357* (2006.01)

(56) References Cited

FOREIGN PATENT DOCUMENTS

| | | |
|---|---|---|
| CN | 110211986 | 9/2019 |
| JP | 2019184977 | 10/2019 |
| TW | M568391 | 10/2018 |

\* cited by examiner

DISPLAY APPARATUS

CROSS-REFERENCE TO RELATED APPLICATION

This application claims the priority benefits of U.S. provisional application Ser. No. 62/950,129, filed on Dec. 19, 2019, and Taiwan application serial no. 109112114, filed on Apr. 10, 2020. The entirety of each of the above-mentioned patent applications is hereby incorporated by reference herein.

BACKGROUND

Technical Field

The invention relates to a display technique, and particularly relates to a display apparatus having micro light emitting diodes.

Description of Related Art

In recent years, under the circumstances that manufacturing cost of organic light-emitting diode (OLED) display panel is high and a service life thereof cannot compete with current mainstream displays, micro LED displays gradually attract attentions of major technology companies. The micro LED display rivals the OLED display for optical performance, such as in advantage of high color saturation, fast response, high contrast, low energy consumption, and longer lifetime.

Generally, a gray level brightness of the micro LED display is proportional to a driving current (or a current density). Namely, in the case of low gray level display, the required driving current is smaller than that required in high gray level display. However, the smaller the driving current is, the lower the controllability thereof is, resulting in fewer controllable gray levels in a low gray level brightness range. In other words, limited by the poor controllability of the low driving current, it is difficult to increase the number of gray levels of the micro LED display in the low gray level brightness range.

SUMMARY

The invention is directed to a display apparatus, which has better controllability of low gray level brightness.

The invention provides a display apparatus including an electrically-controlled phase retardation layer, a reflective polarizer, a micro light emitting diode panel and a reflective layer. The electrically-controlled phase retardation layer has a first side and a second side opposite to each other. The reflective polarizer is disposed at the first side of the electrically-controlled phase retardation layer. The micro light emitting diode panel is disposed at the second side of the electrically-controlled phase retardation layer and includes a circuit substrate and a plurality of micro light emitting diodes electrically bonded to the circuit substrate. The reflective layer is disposed between the reflective polarizer and the circuit substrate. An orthogonal projection of the reflective layer on the circuit substrate is not overlapped with orthogonal projections of the micro light emitting diodes on the circuit substrate.

In an embodiment of the invention, the electrically-controlled phase retardation layer of the display apparatus includes a liquid crystal layer, a first conductive layer and a second conductive layer. The first conductive layer and the second conductive layer are disposed at two opposite sides of the liquid crystal layer. The first conductive layer is located between the liquid crystal layer and the micro light emitting diode panel. The second conductive layer is disposed between the reflective polarizer and the liquid crystal layer.

In an embodiment of the invention, the first conductive layer of the display apparatus includes a plurality of conductive patterns structurally separated from each other, and the conductive patterns are respectively overlapped with the micro light emitting diodes.

In an embodiment of the invention, the reflective layer of the display apparatus is disposed on the circuit substrate and has a plurality of first openings. The micro light emitting diodes are respectively disposed in the first openings of the reflective layer.

In an embodiment of the invention, the micro light emitting diode panel of the display apparatus further includes a plurality of bonding pads disposed on the circuit substrate. The micro light emitting diodes are electrically bonded to the bonding pads, and the reflective layer and the bonding pads are of a same film layer.

In an embodiment of the invention, the display apparatus further includes a light absorption layer, which is disposed on the circuit substrate and is located between the reflective layer and the electrically-controlled phase retardation layer. The light absorption layer has a plurality of second openings, and the micro light emitting diodes are respectively disposed in the second openings of the light absorption layer.

In an embodiment of the invention, the reflective layer of the display apparatus is disposed between the liquid crystal layer and the micro light emitting diode panel. The reflective layer includes a plurality of reflective patterns and a plurality of first openings. The reflective patterns are structurally separated from each other and are respectively provided with the first openings. The first openings are respectively overlapped with the micro light emitting diodes.

In an embodiment of the invention, the display apparatus further includes a light absorption layer disposed between the reflective layer and the reflective polarizer. An orthogonal projection of the light absorption layer on the circuit substrate is located between the orthogonal projections of the micro light emitting diodes on the circuit substrate.

In an embodiment of the invention, the light absorption layer of the display apparatus has a plurality of second openings, and the micro light emitting diodes are respectively disposed in the second openings of the light absorption layer.

In an embodiment of the invention, the light absorption layer is disposed in the liquid crystal layer.

In an embodiment of the invention, a thickness of each of the micro light emitting diodes of the display apparatus is between 5 µm and 10 µm.

In an embodiment of the invention, each of the micro light emitting diodes of the display apparatus is adapted to emit a light beam. A part of the light beam has a first circular polarization after passing through the reflective polarizer, and another part of the light beam has a second circular polarization after being reflected by the reflective polarizer. The first circular polarization is orthogonal to the second circular polarization.

Based on the above description, in the display apparatus of an embodiment of the invention, the reflective layer is disposed between a plurality of the micro light emitting diodes, and the reflective polarizer is disposed at a same side of the micro light emitting diodes and the reflective layer. By disposing the electrically-controlled phase retardation layer between the reflective polarizer and the reflective layer, the driving current of the micro light emitting diode panel is prevented from being too small during low gray level display, which helps to improve controllability of the low gray level brightness. In other words, the display apparatus of the embodiment may have more gray levels in the low gray level brightness range, so as to achieve more delicate gray level performance.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
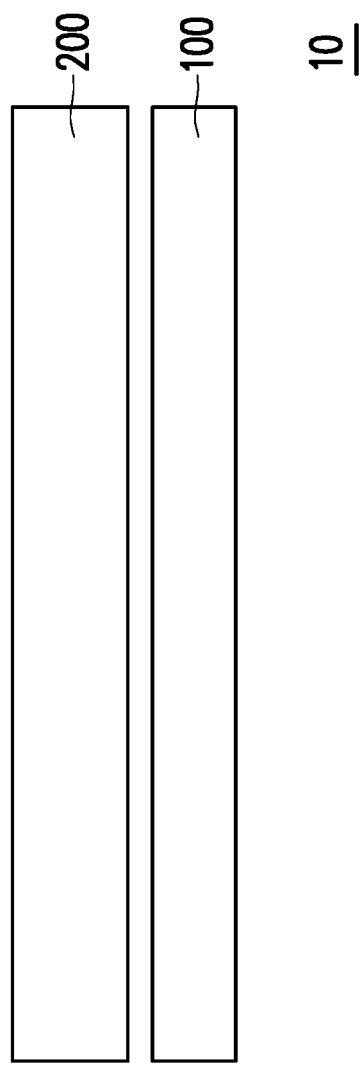
FIG. 1 is a schematic diagram of a display apparatus according to a first embodiment of the invention.

In the accompanying drawings, for clarity's sake, the thicknesses of layers, films, panels, regions, etc., are enlarged. It should be understood that when a device such as a layer, a film, a region, or a substrate is referred to as "on" or "connected" to another device, it may be directly on or connected to the other device, or other devices probably exist there between. Comparatively, when the device is referred to be "directly on" or "directly coupled" to another device, none other device exits there between. The "connection" used herein may refer to both physical and/or electrical connections. Furthermore, "electrical connection" may refer to that there are other devices between the two devices.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
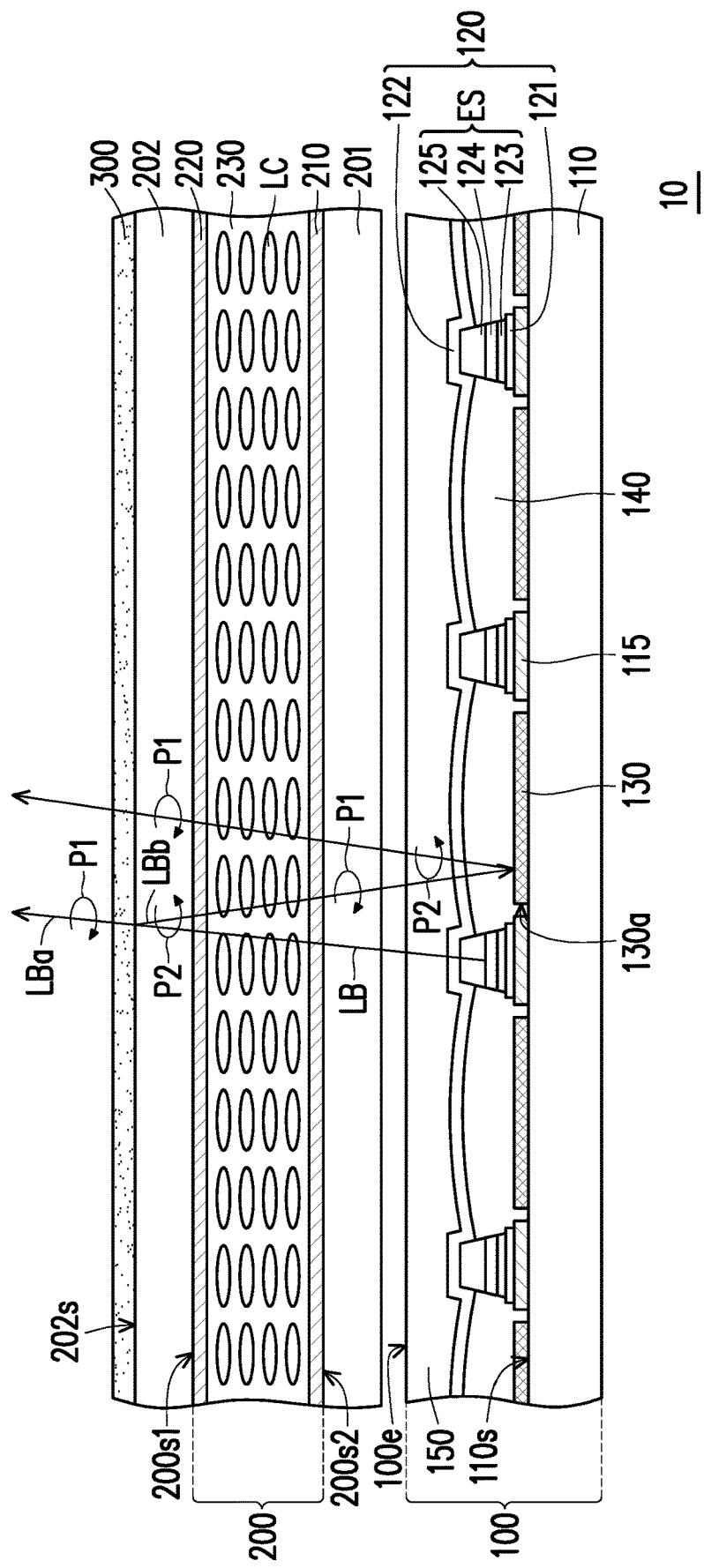
FIG. 2A and FIG. 2B are cross-sectional schematic views of the display apparatus of FIG. 1 operated in different operation modes.
Figure 2B:
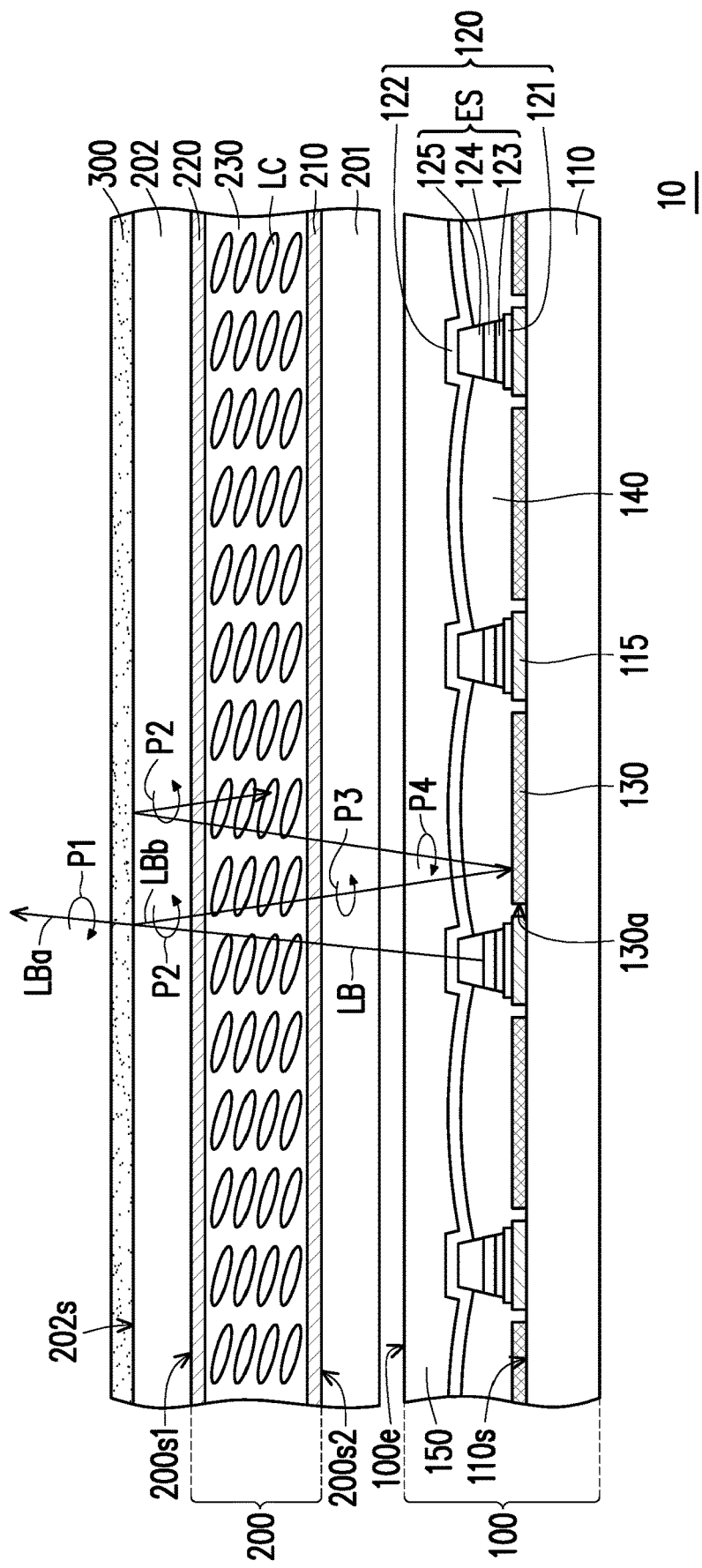

FIG. 1 is a schematic diagram of a display apparatus according to a first embodiment of the invention. FIG. 2A and FIG. 2B are cross-sectional schematic views of the display apparatus of FIG. 1 operated in different operation modes. Referring to FIG. 1, FIG. 2A and FIG. 2B, the display apparatus 10 includes a micro light emitting diode (LED) panel 100, a reflective layer 130, an electrically-controlled phase retardation layer 200 and a reflective polarizer 300. The electrically-controlled phase retardation layer 200 has a first side 200s1 and a second side 200s2 opposite to each other, and a viewer is located at the first side 200s1. The reflective polarizer 300 and the micro LED panel 100 are respectively disposed at the first side 200s1 and the second side 200s2 of the electrically-controlled phase retardation layer 200. Namely, the electrically-controlled phase retardation layer 200 is disposed between the micro LED panel 100 and the reflective polarizer 300, and the first side 200s1 is a display surface.

The micro LED panel 100 includes a circuit substrate 110 and a plurality of micro LEDs 120. The micro LEDs 120 are disposed on a surface 110s of the circuit substrate 110 and respectively electrically bonded to the circuit substrate 110. To be specific, the circuit substrate 110 includes a plurality of bonding pads 115 disposed on the surface 110s, and the micro LEDs 120 are respectively electrically bonded to the bonding pads 115. Namely, the micro LEDs 120 are electrically connected to the circuit substrate 110 through the bonding pads 115. In the embodiment, the reflective layer 130 is disposed on the surface 110s of the circuit substrate 110 of the micro LED panel 100. The reflective layer 130 has a plurality of first openings 130a, and the micro LEDs 120 are respectively disposed in the first openings 130a.

It should be noted that in the embodiment, the reflective layer 130 and the bonding pads 115 may selectively belong to a same film layer. Namely, materials of the reflective layer 130 and the bonding pads 115 may be the same, but the invention is not limited thereto. In other embodiment, the reflective layer and the bonding pads may belong to different film layers and may be made of different materials. On the other hand, the circuit substrate 110 may further include transistor elements, capacitors, scan lines, data lines, power lines, etc., and the bonding pads 115 are, for example, a part of the data lines or conductive patterns connected to the data lines. In other words, the circuit substrate 110 may include an active driving circuit layer, but the invention is not limited thereto. In other embodiments, the circuit substrate 110 may not include the transistor elements. Namely, the circuit substrate 110 may also include a passive driving circuit layer.

For example, the micro LED 120 includes an epitaxial structure ES, a first electrode 121 and a second electrode 122. In the embodiment, the first electrode 121 and the second electrode 122 may be respectively disposed on two opposite sides of the epitaxial structure ES and electrically connected thereto. Namely, the micro LEDs 120 of the embodiment may be vertical type LEDs. However, the invention is not limited thereto, and in other embodiments, the LEDs may also be varied to flip-chip type or lateral type LEDs according to actual design requirements, and such type of the LED may selectively include an insulating layer. The first electrode and the second electrode located on the same side of the epitaxial structure penetrate through the insulating layer to electrically connect the epitaxial structure.

To be specific, in the embodiment, an orthogonal projection of the micro LED 120 on the surface 110s of the circuit substrate 110 is with a length between 3 μm and 60 μm. For example, the length of a vertical type micro LED may be between 3 μm and 15 μm, and may be between 10 μm and 60 μm for the case of a flip-chip type or lateral type micro LED. On the other hand, the micro LED 120 is with a thickness between 5 μm and 10 μm in a normal direction of the surface 110s of the circuit substrate 110.

Further, the micro LEDs 120 may define a plurality of pixels of the micro LED panel 100 (or the display apparatus 10). In the embodiment, each micro LED 120 may be defined as one pixel of the micro LED panel 100, but the invention is not limited thereto. In other embodiments, a number of the micro LEDs 120 included in each pixel of the micro LED panel may also be two or more. For example, in an embodiment, each pixel includes three micro LEDs, which are respectively a red micro LED, a blue micro LED and a green micro LED.

The epitaxial structure ES may include a first type semiconductor layer 123, a light emitting layer 124, and a second type semiconductor layer 125. The first type semiconductor layer 123 and the second type semiconductor layer 125 are respectively located at two opposite sides of the light emitting layer 124 and are respectively electrically connected to the first electrode 121 and the second electrode 122. In the embodiment, the first type semiconductor layer 123 is, for example, a P-type semiconductor, the second type semiconductor layer 125 is, for example, an N-type semiconductor, and the light emitting layer 124 may be a multiple quantum well (MQW) layer, but the invention is not limited thereto.

When the micro LED panel 100 is enabled, the first electrode 121 may be at a high potential, and the second electrode 122 may be at a ground potential or a low potential. A current generated by a potential difference between the first electrode 121 and the second electrode 122 enables the corresponding epitaxial structure ES to emit a (visible) light beam, for example, a light beam LB. To be specific, the micro LED panel 100 may be controlled by active elements of the circuit substrate 110 to, for example, make the first electrodes 121 to be different high potentials, so that the epitaxial structures ES emit light beams LB of different intensities due to different driving currents, so as to form an image frame adapted to be perceived by human eyes.

In the embodiment, the micro LED panel 100 further include a planarization layer 140 covering the epitaxial structure ES, and a plurality of the second electrodes 122 of a plurality of the micro LEDs 120 extend on the planarization layer 140 and are connected with each other to form a transparent common electrode, but the invention is not limited thereto. A material of the planarization layer 140 includes inorganic materials (for example: silicon oxide, silicon nitride, silicon oxynitride, spin on glass (SOG), other suitable materials, or a stacked layer of at least two of the above materials), organic materials, or other suitable materials, or a combination thereof. In the embodiment, the micro LED panel 100 may selectively include a package layer 150 covering the second electrodes 122 of the micro LEDs 120. A material of the package layer 150 may include silicon nitride, aluminium oxide, aluminium nitride carbide, silicon oxynitride, acrylic resin, hexamethyldisiloxane (HMDSO) or glass.

It should be noted that the electrically-controlled phase retardation layer 200 disposed at a light emitting side 100e of the micro LED panel 100 is adapted to reduce an intensity of the light beam LB coming from the micro LED 120. For example, when the display apparatus 10 is to be operated in low gray level display, the electrically-controlled phase retardation layer 200 is enabled to reduce the intensity of the light beam LB coming from the micro LED 120 and generate a brightness corresponding to the low gray level. Under the condition, the driving current of the micro LED 120 is unnecessary to be decreased correspondingly. Therefore, the driving current of the micro LED panel 100 is prevented from being too small during the low gray level display, which helps improving controllability of the low gray level brightness of the display apparatus 10. In other words, the display apparatus 10 of the embodiment may have more gray levels in a low gray level brightness range, so as to achieve more delicate gray level performance.

In the embodiment, the electrically-controlled phase retardation layer 200 includes a first conductive layer 210, a second conductive layer 220 and a liquid crystal layer 230 disposed between the two conductive layers, but the invention is not limited thereto. The first conductive layer 210 is disposed between the liquid crystal layer 230 and the micro LED panel 100. The second conductive layer 220 is disposed between the liquid crystal layer 230 and the reflective polarizer 300. The liquid crystal layer 230, for example, includes a plurality of liquid crystal molecules LC, and an electric field formed between the first conductive layer 210 and the second conductive layer 220 may drive the liquid crystal molecules LC to rotate to form an axial distribution of optical axes corresponding to a magnitude of the electric field. It should be understood that the display apparatus 10 may further include a substrate 201 and a substrate 202. The first conductive layer 210 and the second conductive layer 220 are respectively disposed on the substrate 201 and the substrate 202, and the reflective polarizer 300 may be attached to a surface 202s of the substrate 202 away from the liquid crystal layer 230, but the invention is not limited thereto. In the embodiment, the first conductive layer 210 and the second conductive layer 220 are light transmissive electrodes, and a material of the light transmissive electrode includes metal oxides, such as indium tin oxide, indium zinc oxide, aluminium tin oxide, aluminium zinc oxide, or other suitable oxides, or a stacked layer of at least two of the above materials, but the invention is not limited thereto.

The reflective polarizer 300 is, for example, a stacked structure of a wire grid polarizer (WGP) and two quarter-wavelength phase retardation films, where the two quarter-wavelength phase retardation films are respectively disposed at two opposite sides of the wire grid polarizer. However, the invention is not limited thereto, and in other embodiments, the number of the quarter-wavelength phase retardation films of the reflective polarizer 300 may also be one, and the one quarter-wavelength phase retardation film is disposed between the wire grid polarizer and the electrically-controlled phase retardation layer 200. For example, in the embodiment, a part of the light beam LB coming from the micro LED 120 passes through the reflective polarizer 300 to form a light beam LBa with a first circular polarization P1, and the other part of the light beam LB is reflected by the reflective polarizer 300 to form a light beam LBb with a second circular polarization P2, and the first circular polarization P1 is orthogonal to the second circular polarization P2, but the invention is not limited thereto.

Referring to FIG. 2A, when the display apparatus 10 is operated in a high-brightness display mode (for example, when the image frame is brighter), the electrically-controlled phase retardation layer 200 is not enabled (i.e., none electric field is generated between the first conductive layer 210 and the second conductive layer 220). In this case, after the light beam LBb with the second circular polarization P2 passes through the electrically-controlled phase retardation layer 200, the second circular polarization P2 thereof is changed to the first circular polarization P1. Namely, at this moment, the electrically-controlled phase retardation layer 200 has a phase retardation amount of a half wavelength. It should be noted that the light beam LBb coming from the electrically-controlled phase retardation layer 200 forms the light beam LBb with the second circular polarization P2 after being reflected by the reflective layer 130. After the light beam LBb reflected by the reflective layer 130 passes through the electrically-controlled phase retardation layer 200, a polarization state thereof is changed from the second circular polarization P2 to the first circular polarization P1, and the light beam LBb with the first circular polarization P1 may pass through the reflective polarizer 300. Namely, after the light beam LB coming from the micro LED 120 passes through the disabled electrically-controlled phase retardation layer 200 and the reflective polarizer 300, a light intensity thereof substantially remains unchanged.

On the other hand, when the display apparatus 10 is operated in a low-brightness display mode (for example, when the image frame is relatively dim), the electrically-controlled phase retardation layer 200 is enabled, as shown in FIG. 2B. In this case, after the light beam LBb with the second circular polarization P2 passes through the electrically-controlled phase retardation layer 200, the second circular polarization P2 thereof is changed to an elliptical polarization P3. Namely, at this moment, the electrically-controlled phase retardation layer 200 may have a phase retardation amount less than a quarter wavelength (or more than the quarter wavelength and less than a half wavelength), but the invention is not limited thereto. It should be noted that the light beam LBb coming from the electrically-controlled phase retardation layer 200 forms the light beam LBb with an elliptical polarization P4 after being reflected by the reflective layer 130. After the light beam LBb reflected by the reflective layer 130 passes through the electrically-controlled phase retardation layer 200, a polarization state thereof is changed from the elliptical polarization P4 to the second circular polarization P2, and the light beam LBb with the second circular polarization P2 is reflected again by the reflective polarizer 300. Namely, after the light beam LB coming from the micro LED 120 passes through the enabled electrically-controlled phase retardation layer 200 and the reflective polarizer 300, the light intensity thereof is reduced.

According to another aspect, by applying the electrically-controlled phase retardation layer 200, when the display apparatus 10 is switched from the high-brightness display mode to the low-brightness display mode, the driving current of the micro LED panel 100 is unnecessary to be lowered too much to achieve the required gray level brightness value. Since the driving current of the micro LED 120 during the low gray level display is still maintained within a stably controllable range, the display apparatus 10 may have more gray levels in the low gray level brightness range, which helps achieving more delicate gray level performance.

Further, an adhesive layer (not shown) may be selectively provided between the micro LED panel 100 and the electrically-controlled phase retardation layer 200 to connect the micro LED panel 100 and the electrically-controlled phase retardation layer 200. The adhesive layer may be a pressure sensitive adhesive (PSA), an optically clear adhesive (OCA), a UV adhesive, or an optical clear resin (OCR). In the embodiment, the adhesive layer may be integrally overlapped with the micro LED panel 100 and the electrically-controlled phase retardation layer 200. Namely, the micro LED panel 100 and the electrically-controlled phase retardation layer 200 may be combined in a direct bond manner. It should be noted that the bonding method between the micro LED panel 100 and the electrically-controlled phase retardation layer 200 is not limited by the invention. For example, the electrically-controlled phase retardation layer 200 may also be bonded to the micro LED panel 100 with other suitable components, such as a frame assembly.

Some other embodiments are provided below to describe the invention in detail, where the same components are denoted by the same referential numbers, and descriptions of the same technical contents are omitted. The aforementioned embodiment may be referred for descriptions of the omitted parts, and detailed descriptions thereof are not repeated in the following embodiments.

Figure 3A:
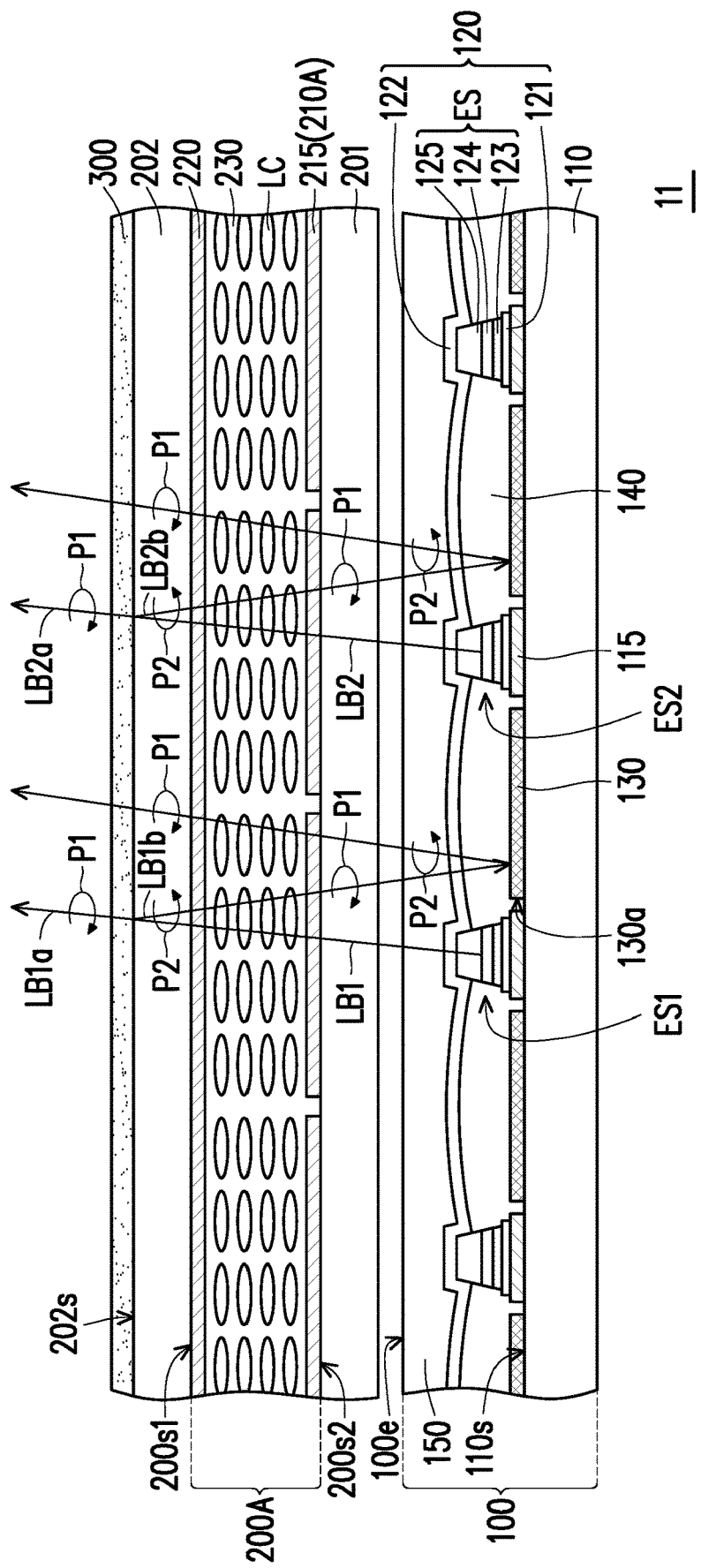
FIG. 3A and FIG. 3B are cross-sectional schematic views of a display apparatus operated in different display modes according to a second embodiment of the invention.
Figure 3B:
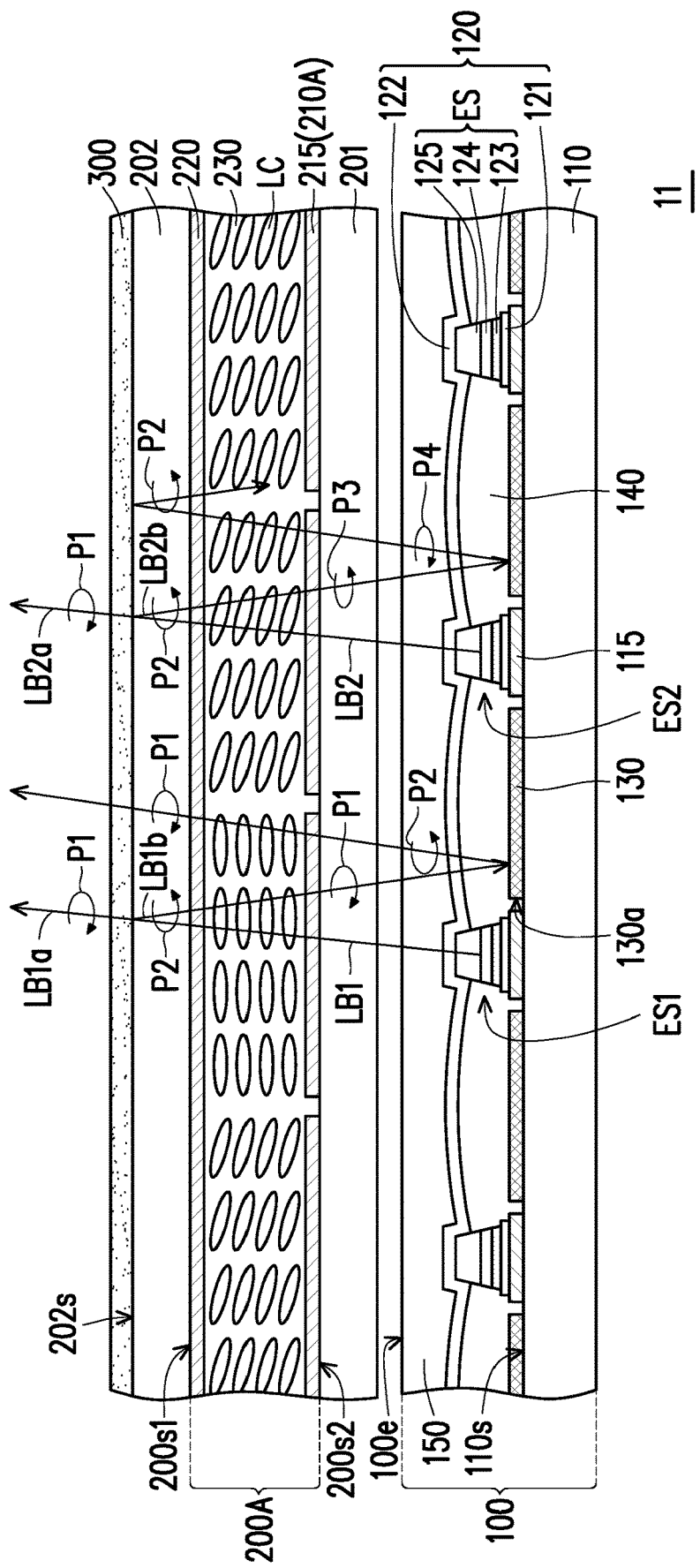

FIG. 3A and FIG. 3B are cross-sectional schematic views of a display apparatus operated in different display modes according to a second embodiment of the invention. Referring to FIG. 3A and FIG. 3B, a difference between a display apparatus 11 of the embodiment and the display apparatus 10 of FIG. 2A lies in a different configuration of a first conductive layer of an electrically-controlled phase retardation layer. In the embodiment, a first conductive layer 210A of an electrically-controlled phase retardation layer 200A of the display apparatus 11 includes a plurality of conductive patterns 215 structurally separated from each other, and the conductive patterns 215 are respectively overlapped with a plurality of the micro LEDs 120 of the micro LED panel 100.

To be specific, the conductive patterns 215 of the electrically-controlled phase retardation layer 200A may define a plurality of modulation regions of the electrically-controlled phase retardation layer 200A, and the modulation regions are respectively overlapped with a plurality of the micro LEDs 120 of the micro LED panel 100 in a normal direction of the surface 110s of the circuit substrate 110. Namely, the electrically-controlled phase retardation layer 200A of the embodiment may individually adjust light intensities of the light beams (for example, the light beam LB1 and the light beam LB2) coming from a plurality of pixels (i.e., a plurality of the micro LEDs 120) of the micro LED panel 100 after passing through the reflective polarizer 300.

Referring to FIG. 3A, for example, a part of the light beam LB1 coming from an epitaxial structure ES1 passes through the reflective polarizer 300 to form a light beam LB1a with the first circular polarization P1, and the other part of the light beam LB1 is reflected by the reflective polarizer 300 to form a light beam LB1b with the second circular polarization P2. Similarly, a part of the light beam LB2 coming from an epitaxial structure ES2 passes through the reflective polarizer 300 to form a light beam LB2a with the first circular polarization P1, and the other part of the light beam LB2 is reflected by the reflective polarizer 300 to form a light beam LB2b with the second circular polarization P2.

When the display apparatus 11 is operated in the high-brightness display mode (for example, when the image frame is brighter), the electrically-controlled phase retardation layer 200A is not enabled (i.e., no electric field is generated between the first conductive layer 210A and the second conductive layer 220A). In this case, after the light beam LB1b (or the light beam LB2b) with the second circular polarization P2 passes through the electrically-controlled phase retardation layer 200A, the second circular polarization P2 thereof is changed to the first circular polarization P1. Namely, at this moment, the electrically-controlled phase retardation layer 200A has a phase retardation amount of a half wavelength. It should be noted that the light beam LB1b (or the light beam LB2b) coming from the electrically-controlled phase retardation layer 200A forms the light beam LB1b (or the light beam LB2b) with the second circular polarization P2 after being reflected by the reflective layer 130. After the light beam LB1b (or the light beam LB2b) reflected by the reflective layer 130 passes through the electrically-controlled phase retardation layer 200A, a polarization state thereof is changed from the second circular polarization P2 to the first circular polarization P1, and the light beam LB1b (or the light beam LB2b)

with the first circular polarization P1 may pass through the reflective polarizer 300. Namely, after the light beam LB1 and the light beam LB2 coming from the epitaxial structure ES1 and the epitaxial structure ES2 pass through the disabled electrically-controlled phase retardation layer 200A and the reflective polarizer 300, the light intensities thereof substantially remain unchanged.

On the other hand, when a part of the pixels (for example, the micro LED 120 of the epitaxial structure ES2) of the display apparatus 11 is operated in the low-brightness display mode, a part of the electrically-controlled phase retardation layer 200A corresponding to the pixels (i.e. a part of the modulation regions) is enabled, as shown in FIG. 3B. In this case, after the light beam LB2b with the second circular polarization P2 passes through the electrically-controlled phase retardation layer 200A, the second circular polarization P2 thereof is changed to the elliptical polarization P3. For example, at this moment, the enabled part of the electrically-controlled phase retardation layer 200A may have a phase retardation amount less than a quarter wavelength (or more than the quarter wavelength and less than a half wavelength), but the invention is not limited thereto. It should be noted that the light beam LB2b coming from the electrically-controlled phase retardation layer 200A forms the light beam LB2b with the elliptical polarization P4 after being reflected by the reflective layer 130. After the light beam LB2b reflected by the reflective layer 130 passes through the electrically-controlled phase retardation layer 200A, a polarization state thereof is changed from the elliptical polarization P4 to the second circular polarization P2, and the light beam LB2b with the second circular polarization P2 is reflected again by the reflective polarizer 300.

Namely, after the light beam LB2 coming from the epitaxial structure ES2 passes through the enabled electrically-controlled phase retardation layer 200A and the reflective polarizer 300, the light intensity thereof is reduced. In this way, the driving current of the micro LED 120 (for example, the micro LED 120 including the epitaxial structure ES2) is prevented from being too small during the low gray level display, which helps improving controllability of the low gray level brightness of the display apparatus 11. In other words, the display apparatus 11 of the embodiment may have more gray levels in a low gray level brightness range, so as to achieve more delicate gray level performance.

It should be noted that the modulation regions of the electrically-controlled phase retardation layer 200A and the micro LEDs 120 of the micro LED panel 100 of the embodiment is one-to-one, but the invention is not limited thereto. In other embodiments, the modulation regions of the electrically-controlled phase retardation layer and the micro LEDs 120 of the micro LED panel 100 may also be one-to-plural. Namely, each of the modulation regions of the electrically-controlled phase retardation layer is overlapped with at least two or more micro LEDs 120 of the micro LED panel 100.

Figure 4:
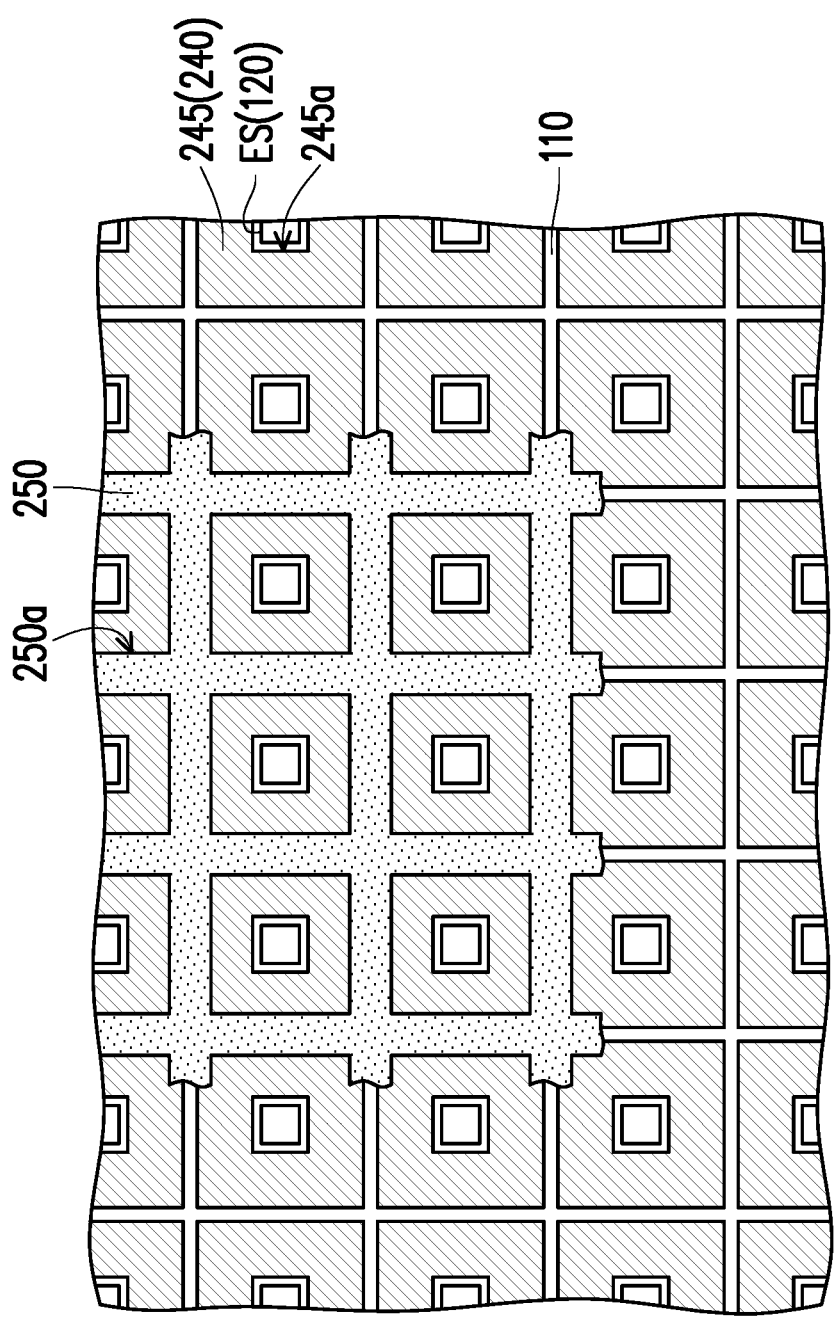
FIG. 4 is a schematic top view of a display apparatus according to a third embodiment of the invention.
Figure 5A:
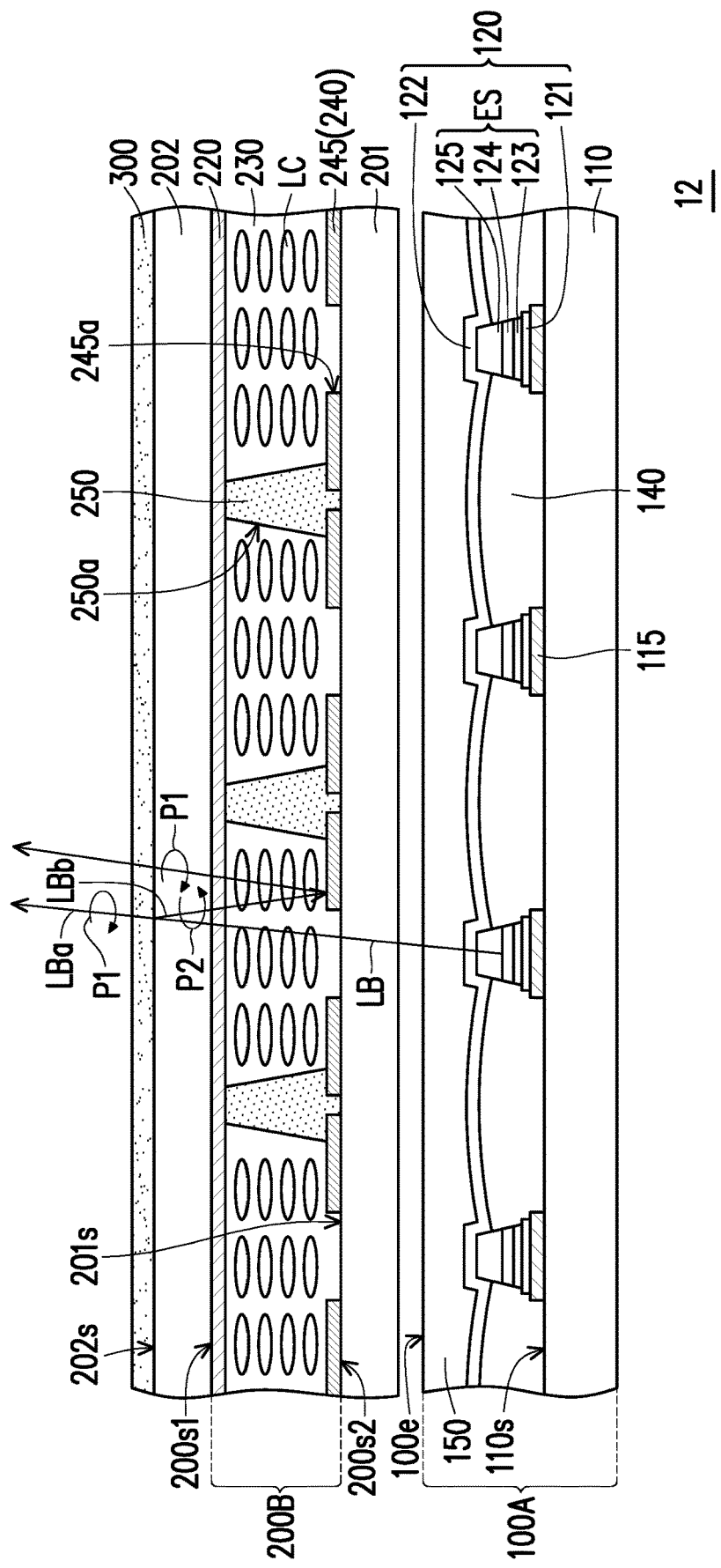
FIG. 5A and FIG. 5B are cross-sectional schematic views of the display apparatus of FIG. 4 operated in different display modes.
Figure 5B:
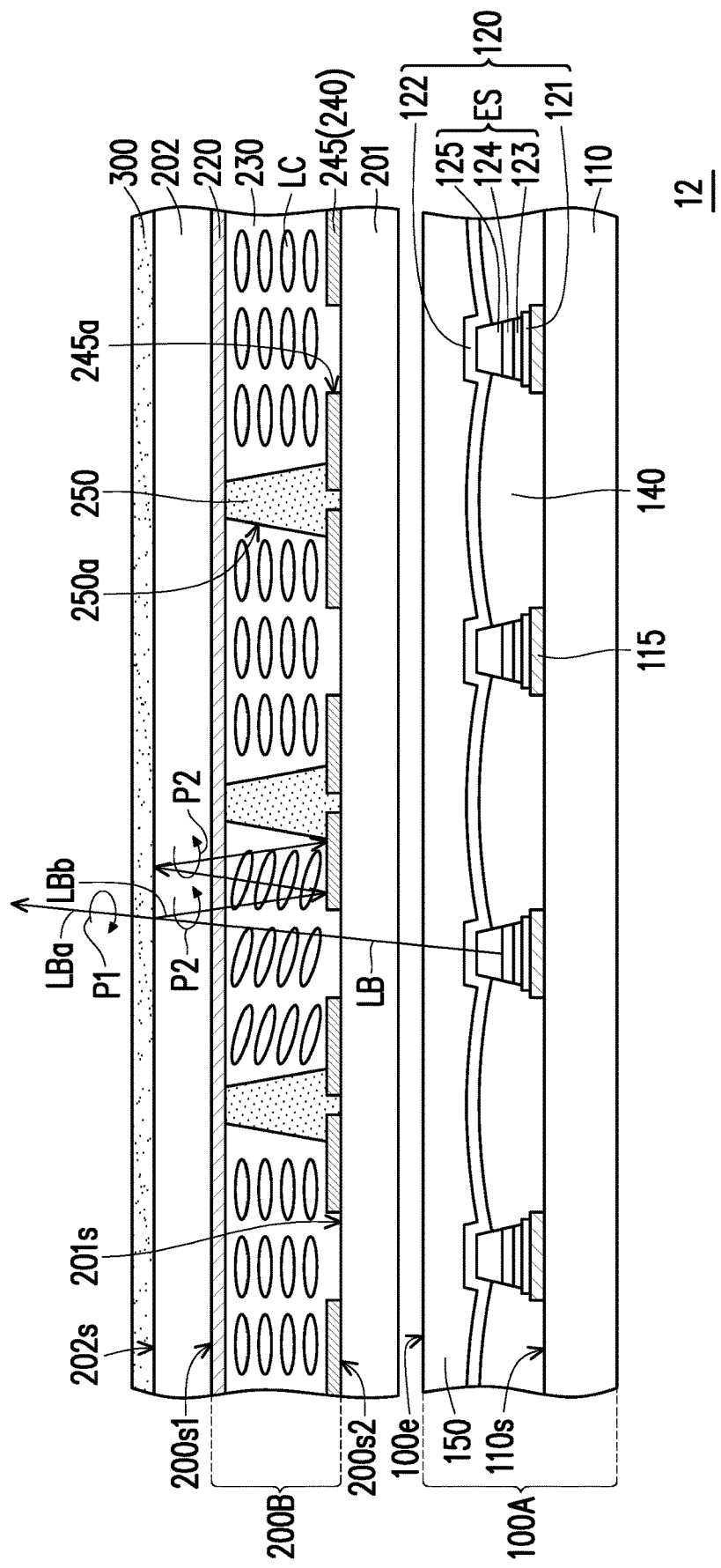

FIG. 4 is a schematic top view of a display apparatus according to a third embodiment of the invention. FIG. 5A and FIG. 5B are cross-sectional schematic views of the display apparatus of FIG. 4 operated in different display modes. It should be noted that for clarity's sake, in FIG. 4, only the circuit substrate 110, the epitaxial structure ES, a reflective layer 240 and a light absorption layer 250 of FIG. 5A are illustrated.

Referring to FIG. 4, FIG. 5A and FIG. 5B, a difference between the display apparatus 12 of the embodiment and the display apparatus 11 of FIG. 3A lies in a different composition of the display apparatus and a different configuration of the reflective layer. To be specific, the reflective layer 240 of the display apparatus 12 is disposed between the liquid crystal layer 230 and the micro LED panel 100A. The reflective layer 240 includes a plurality of reflective patterns 245 and a plurality of first openings 245a. Each of the reflective patterns 245 are respectively provided with one of the first opening 245a. The first openings 245a are respectively overlapped with the micro LEDs 120 of the micro LED panel 100A in the normal direction of the surface 110s of the circuit substrate 110.

To be specific, an orthogonal projection of the reflective layer 240 on the circuit substrate 110 is not overlapped with orthogonal projections of the micro LEDs 120 on the circuit substrate 110, and orthogonal projections of the reflective patterns 245 on the circuit substrate 110 may surround the orthogonal projections of the micro LEDs 120 on the circuit substrate 110, but the invention is not limited thereto. It should be noted that the reflective patterns 245 of the reflective layer 240 of the embodiment may also be used to replace the first conductive layer 210 shown in FIG. 2A. Namely, the reflective layer 240 is disposed on a surface 201s of the substrate 201. In the embodiment, the reflective layer 240 is, for example, a reflective electrode, and a material of the reflective electrode includes metals, alloys, nitrides of a metal material, oxides of a metal material, oxynitrides of a metal material, or other suitable materials, or a stacked layer of metal materials and other conductive materials.

Referring to FIG. 5A, for example, a part of the light beam LB coming from the micro LED 120 passes through the reflective polarizer 300 to form a light beam LBa with the first circular polarization P1, and the other part of the light beam LB is reflected by the reflective polarizer 300 to form a light beam LBb with the second circular polarization P2. When the display apparatus 12 is operated in the high-brightness display mode (for example, when the image frame is brighter), the electrically-controlled phase retardation layer 200B is not enabled (i.e., none electric field is generated between reflective layer 240 and the second conductive layer 220). In this case, after the light beam LBb with the second circular polarization P2 passes through the electrically-controlled phase retardation layer 200B twice and is reflected by the reflective pattern 245, it is transformed into the light beam LBb with the first circular polarization P1, and the light beam LBb with the first circular polarization P1 may pass through the reflective polarizer 300. Namely, after the light beam LB coming from the micro LED 120 passes through the disabled electrically-controlled phase retardation layer 200B and the reflective polarizer 300, the light intensity thereof substantially remains unchanged.

On the other hand, when a part of the pixels of the display apparatus 12 is operated in the low-brightness display mode, a part of the electrically-controlled phase retardation layer 200B corresponding to the pixels (i.e. a part of the modulation regions) is enabled, as shown in FIG. 5B. In this case, after the light beam LBb with the second circular polarization P2 passes through the electrically-controlled phase retardation layer 200B twice and is reflected by the reflective pattern 245, it is transformed into the light beam LBb with the second circular polarization P2, and the light beam LBb with the second circular polarization P2 is reflected again by the reflective polarizer 300. For example, the enabled part of the electrically-controlled phase retardation layer 200B may have a phase retardation amount less than a quarter wavelength (or more than the quarter wavelength and less than a half wavelength), but the invention is not limited thereto.

To be more specific, after the light beam LBb coming from the micro LED 120 passes through the enabled electrically-controlled phase retardation layer 200B and the reflective polarizer 300, the light intensity thereof is reduced. In this way, the driving current of the micro LED 120 is prevented from being too small during the low gray level display, which helps improving controllability of the low gray level brightness of the display apparatus 12. In other words, the display apparatus 12 of the embodiment may have more gray levels in the low gray level brightness range, so as to achieve more delicate gray level performance.

Further, the display apparatus 12 further includes the light absorption layer 250, which is disposed between the reflective layer 240 and the reflective polarizer 300. An orthogonal projection of the light absorption layer 250 on the circuit substrate 110 is located between the orthogonal projections of the micro LEDs 120 on the circuit substrate 110. The light absorption layer 250 has a plurality of second openings 250a, and is disposed in the liquid crystal layer 230 of the electrically-controlled phase retardation layer 200B. To be more specific, the orthogonal projection of the light absorption layer 250 on the circuit substrate 110 is grid like (as shown in FIG. 4), but the invention is not limited thereto.

Referring to FIG. 5B, by configuring the light absorption layer 250, a situation that the light beam LBb reflected by the reflective polarizer 300 passes through the enabled part of the electrically-controlled phase retardation layer 200B and is laterally transmitted to a disabled part of the electrically-controlled phase retardation layer 200B to form the light beam LBb with the first circular polarization P1 to pass through the reflective polarizer 300 is avoided. In other words, the light absorption layer 250 is used to absorb the light beam LBb reflected by the reflective polarizer 300 and passing through the enabled part of the electrically-controlled phase retardation layer 200B. In this way, a contrast of the display apparatus 12 during the low gray level display may be further improved.

Figure 6:
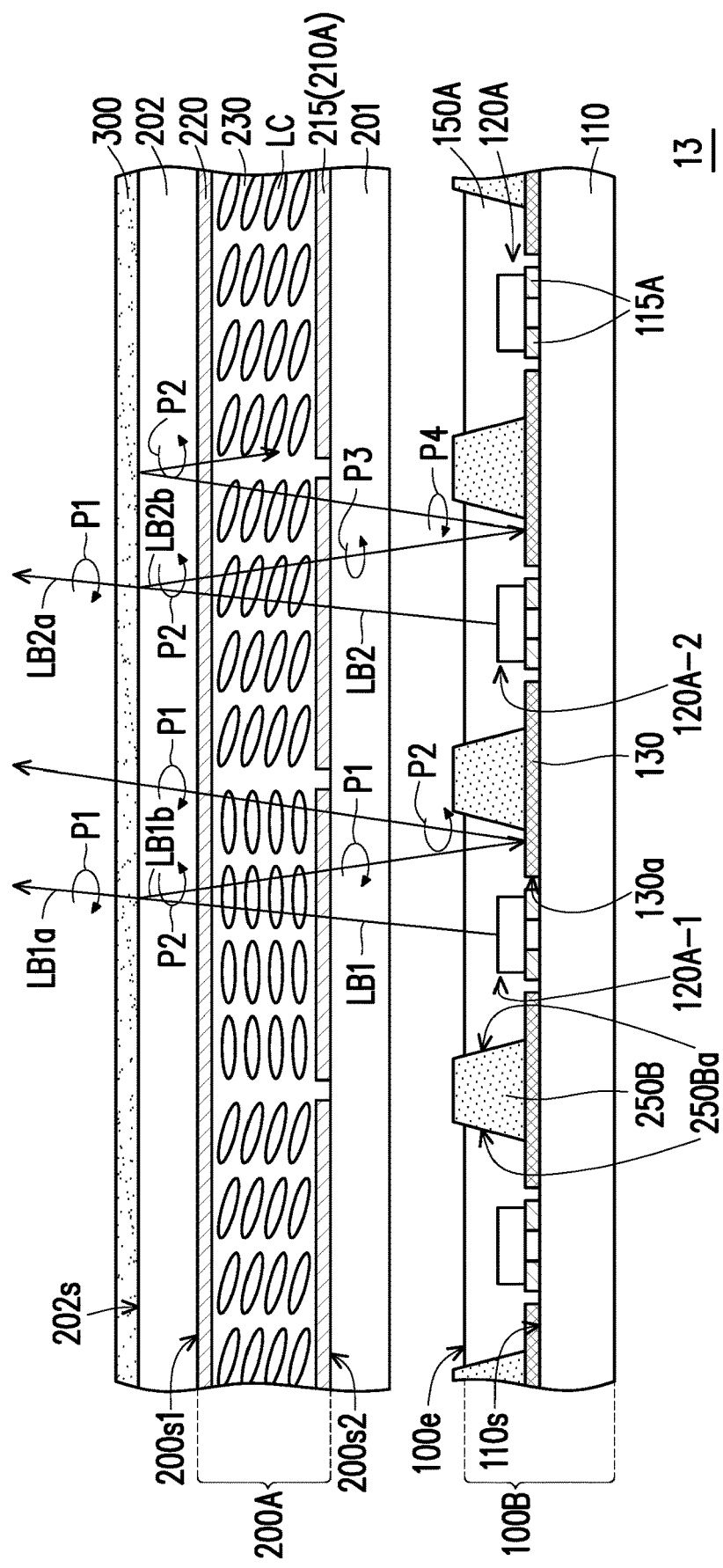
FIG. 6 is a cross-sectional schematic view of a display apparatus operated in a low-brightness display mode according to a fourth embodiment of the invention.

FIG. 6 is a cross-sectional schematic view of a display apparatus operated in a low-brightness display mode according to a fourth embodiment of the invention. Referring to FIG. 6, a difference between a display apparatus 13 of the embodiment and the display apparatus 11 of FIG. 3B lies in a different composition of the display apparatus and a different type of the micro LED. To be specific, the micro LED 120A of the micro LED panel 100B of the display apparatus 13 is, for example, a flip-chip type LED, and a number of bonding pads 115A on the circuit substrate 110 for electrically bonding the LED 120A is two. For example, a first electrode (not shown) and a second electrode (not shown) of the micro LED 120A are respectively electrically bonded to the two bonding pads 115A.

On the other hand, the display apparatus 13 may further include a light absorption layer 250B disposed on the circuit substrate 110 and located between the reflective layer 130 and the electrically-controlled phase retardation layer 200A. In the embodiment, the light absorption layer 250B may have a plurality of second openings 250Ba. The micro LEDs 120A are respectively disposed in the second openings 250Ba of the light absorption layer 250B, and a package layer 150A is filled in the second openings 250Ba to cover the micro LEDs 120A. For example, an orthogonal projection of the light absorption layer 250B on the circuit substrate 110 is grid like (shown as the light absorption layer 250 in FIG. 4), but the invention is not limited thereto.

By configuring the light absorption layer 250B, a situation that the light beam LB2b reflected by the reflective polarizer 300 passes through the enabled part of the electrically-controlled phase retardation layer 200A (for example, the part of the electrically-controlled phase retardation layer 200A that is overlapped with the micro LED 120A-2) and is laterally transmitted to a disabled part of the electrically-controlled phase retardation layer 200A (for example, the part of the electrically-controlled phase retardation layer 200A that is overlapped with the micro LED 120A-1) to form the light beam LB2b with the first circular polarization P1 to pass through the reflective polarizer 300 is avoided. In other words, the light absorption layer 250B is adapted to absorb the light beam LB2b reflected by the reflective polarizer 300 and passing through the enabled part of the electrically-controlled phase retardation layer 200A. In this way, a contrast of the display apparatus 13 during the low gray level display may be further improved.

In summary, in the display apparatus of an embodiment of the invention, the reflective layer is disposed between a plurality of the micro LEDs, and the reflective polarizer is disposed at a same side of the micro LEDs and the reflective layer. By configuring the electrically-controlled phase retardation layer between the reflective polarizer and the reflective layer, the driving current of the micro light emitting diode panel is prevented from being too small during low gray level display, which helps to improve controllability of the low gray level brightness. In other words, the display apparatus of the embodiment may have more gray levels in the low gray level brightness range, so as to achieve more delicate gray level performance.

What is claimed is:

1. A display apparatus, comprising:
   an electrically-controlled phase retardation layer, having a first side and a second side opposite to each other;
   a reflective polarizer, disposed at the first side of the electrically-controlled phase retardation layer;
   a micro light emitting diode panel, disposed at the second side of the electrically-controlled phase retardation layer, and comprising:
      a circuit substrate; and
      a plurality of micro light emitting diodes, electrically bonded to the circuit substrate; and
   a reflective layer, disposed between the reflective polarizer and the circuit substrate, wherein an orthogonal projection of the reflective layer on the circuit substrate is not overlapped with orthogonal projections of the micro light emitting diodes on the circuit substrate.

2. The display apparatus as claimed in claim 1, wherein the electrically-controlled phase retardation layer comprises:
   a liquid crystal layer, and
   a first conductive layer and a second conductive layer, disposed at two opposite sides of the liquid crystal layer, wherein the first conductive layer is located between the liquid crystal layer and the micro light emitting diode panel, and the second conductive layer is disposed between the reflective polarizer and the liquid crystal layer.

3. The display apparatus as claimed in claim 2, wherein the first conductive layer comprises a plurality of conductive patterns structurally separated from each other, and the conductive patterns are respectively overlapped with the micro light emitting diodes.

4. The display apparatus as claimed in claim 1, wherein the reflective layer is disposed on the circuit substrate and has a plurality of first openings, and the micro light emitting diodes are respectively disposed in the first openings of the reflective layer.

5. The display apparatus as claimed in claim 4, wherein the micro light emitting diode panel further comprises a plurality of bonding pads disposed on the circuit substrate, the micro light emitting diodes are electrically bonded to the bonding pads, and the reflective layer and the bonding pads are of a same film layer.

6. The display apparatus as claimed in claim 4, further comprising:
a light absorption layer, disposed on the circuit substrate and located between the reflective layer and the electrically-controlled phase retardation layer, wherein the light absorption layer has a plurality of second openings, and the micro light emitting diodes are respectively disposed in the second openings of the light absorption layer.

7. The display apparatus as claimed in claim 2, wherein the reflective layer is disposed between the liquid crystal layer and the micro light emitting diode panel, and the reflective layer comprises:
a plurality of reflective patterns, structurally separated from each other; and
a plurality of first openings, respectively overlapped with the micro light emitting diodes, wherein each of the reflective patterns are respectively provided with one of the first openings.

8. The display apparatus as claimed in claim 7, further comprising:
a light absorption layer, disposed between the reflective layer and the reflective polarizer, wherein an orthogonal projection of the light absorption layer on the circuit substrate is located between the orthogonal projections of the micro light emitting diodes on the circuit substrate.

9. The display apparatus as claimed in claim 8, wherein the light absorption layer has a plurality of second openings, and the micro light emitting diodes are respectively disposed in the second openings of the light absorption layer.

10. The display apparatus as claimed in claim 8, wherein the light absorption layer is disposed in the liquid crystal layer.

11. The display apparatus as claimed in claim 1, wherein a thickness of each of the micro light emitting diodes is between 5 μm and 10 μm.

12. The display apparatus as claimed in claim 1, wherein each of the micro light emitting diodes is adapted to emit a light beam, a part of the light beam has a first circular polarization after passing through the reflective polarizer, another part of the light beam has a second circular polarization after being reflected by the reflective polarizer, and the first circular polarization is orthogonal to the second circular polarization.

* * * * *